(12) United States Patent
Chung

(10) Patent No.: US 11,386,938 B2
(45) Date of Patent: Jul. 12, 2022

(54) STORAGE DEVICE AND OPERATING METHOD OF THE STORAGE DEVICE

(71) Applicant: SK hynix Inc., Icheon-si (KR)

(72) Inventor: Seung Hyun Chung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/188,921

(22) Filed: Mar. 1, 2021

(65) Prior Publication Data

US 2022/0059142 A1 Feb. 24, 2022

(30) Foreign Application Priority Data

Aug. 24, 2020 (KR) .......................... 10-2020-0106469

(51) Int. Cl.
G11C 7/10 (2006.01)
G11C 8/18 (2006.01)
G11C 7/22 (2006.01)

(52) U.S. Cl.
CPC .......... *G11C 7/1045* (2013.01); *G11C 7/1051* (2013.01); *G11C 7/1096* (2013.01); *G11C 7/22* (2013.01); *G11C 8/18* (2013.01)

(58) Field of Classification Search
CPC ................................ G11C 7/10; G11C 7/1045
USPC .................................................. 365/189.011
See application file for complete search history.

(56) References Cited

U.S. PATENT DOCUMENTS

| | | | | |
|---|---|---|---|---|
| 11,086,722 B2* | 8/2021 | Lee | ...................... | G06F 11/1471 |
| 2013/0315012 A1* | 11/2013 | Fujioka | .................. | G11C 14/00 |
| | | | | 365/189.011 |
| 2014/0063943 A1* | 3/2014 | Nagashima | ............ | G11C 16/12 |
| | | | | 365/185.23 |
| 2015/0098296 A1* | 4/2015 | Na | ........................ | G11C 29/028 |
| | | | | 365/233.1 |
| 2019/0295665 A1* | 9/2019 | Kojima | ..................... | G11C 7/04 |
| 2019/0372592 A1* | 12/2019 | Kim | ................... | H03M 13/1171 |
| 2020/0110708 A1* | 4/2020 | Ma | ...................... | G06F 12/0246 |
| 2020/0334166 A1* | 10/2020 | Byun | .................. | G06F 12/0246 |

FOREIGN PATENT DOCUMENTS

| KR | 1020110131714 A | 12/2011 |
|---|---|---|
| KR | 101437517 B1 | 9/2014 |
| KR | 1020170029261 A | 3/2017 |
| KR | 1020180109140 A | 10/2018 |

\* cited by examiner

*Primary Examiner* — Muna A Techane
(74) *Attorney, Agent, or Firm* — William Park & Associates Ltd.

(57) ABSTRACT

A memory device includes: memory cells; an operation mode determiner for determining any one of a normal operation mode and a memory communication operation mode of communicating data with another memory device; a pad control signal generator for generating a pad control signal for determining a pad to receive a signal corresponding to a data movement command of the memory controller according to the determined operation mode; a pad controller for receiving the signal through the determined pad according to the pad control signal; an internal command generator for generating an internal operation command corresponding to the data movement command according to the determined operation mode; and an operation controller for performing one of a read operation of reading first target data from the memory cells and a program operation of storing second target data in the memory cells, based on the internal operation command.

20 Claims, 13 Drawing Sheets

STORAGE DEVICE AND OPERATING METHOD OF THE STORAGE DEVICE

CROSS-REFERENCE TO RELATED APPLICATION

The present application claims priority under 35 U.S.C. § 119(a) to Korean patent application number 10-2020-0106469, filed on Aug. 24, 2020, in the Korean Intellectual Property Office, the entire disclosure of which is incorporated herein by reference.

BACKGROUND

1. Technical Field

The present disclosure generally relates to an electronic device, and more particularly, to a storage device and an operating method of the storage device.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data isn't lost even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there may be provided a memory device including: a plurality of memory cells; an operation mode determiner configured to determine any one of a normal operation mode and a memory communication operation mode of communicating data with another memory device according to an operation mode command input from a memory controller; a pad control signal generator configured to generate a pad control signal for determining a pad to receive a signal corresponding to a data movement command of the memory controller according to the determined operation mode; a pad controller configured to receive the signal corresponding to the data movement command through the determined pad according to the pad control signal; an internal command generator configured to generate an internal operation command corresponding to the data movement command according to the determined operation mode; and an operation controller configured to perform one of a read operation of reading first target data to be output to the another memory device from the plurality of memory cells and a program operation of storing second target data input from the another memory device in the plurality of memory cells, based on the internal operation command.

In accordance with another aspect of the present disclosure, there may be provided a method for operating a memory device which includes a plurality of memory cells and transmits and receives data with another memory device, the method including: receiving an operation mode command input from a memory controller; determining any one of a normal operation mode and a memory communication operation mode according to the operation mode command; receiving a data movement command input from the memory controller; generating a pad control signal for determining a pad to receive a signal corresponding to the data movement command according to the determined operation mode; receiving the signal corresponding to the data movement command through the determined pad according to the pad control signal; generating an internal operation command corresponding to the data movement command according to the determined operation mode; and performing one of a read operation of reading first target data to be output to the another memory device from the plurality of memory cells and a program operation of storing second target data input from the another memory device in the plurality of memory cells, based on the internal operation command.

In the performing of the one of the read operation of reading the first target data to be output to the another memory device from the plurality of memory cells and the program operation of storing the second target data input from the another memory device in the plurality of memory cells, the first target data may be directly transferred to the another memory device without passing through the memory controller.

In accordance with still another aspect of the present disclosure, there may be provided a storage device including: a first memory device configured to perform a read operation in response to a data movement command according to a first operation mode, and output data read by the read operation; a second memory device configured to receive the data from the first memory device, and perform a program operation of storing data in response to the data movement command according to a second operation mode; and a memory controller configured to control the first memory device and the second memory device such that data read from the first memory device is moved to the second memory device by providing an operation mode command and the data movement command to each of the first memory device and the second memory device.

The first operation mode may be a data output mode for reading and outputting the data, and the second operation mode may be a data input mode for receiving and storing the data.

The first memory device may determine an operation mode of the first memory device as the first operation mode in response to the operation mode command, and the second memory device may determine an operation mode of the second memory device as the second operation mode in response to the operation mode command.

The first memory device may generate a read enable control signal for controlling a read enable (RE) pad according to the first operation mode, and receive a signal corresponding to the data movement command and an output address through the read enable pad according to the read enable control signal.

The first memory device may sense the data from the output address among memory cells included in the first memory device and output the sensed data to the second memory device, in response to the data movement command.

The second memory device may generate a data strobe control signal for controlling a data strobe (DQS) pad according to the second operation mode, and receive a signal corresponding to the data movement command, an input address, and the data through the data strobe pad according to the data strobe control signal.

The second memory device may program the data in an area selected by the input address among memory cells included in the second memory device in response to the data movement command.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a storage device having an improved operation speed and an operating method thereof.

Figure 1:
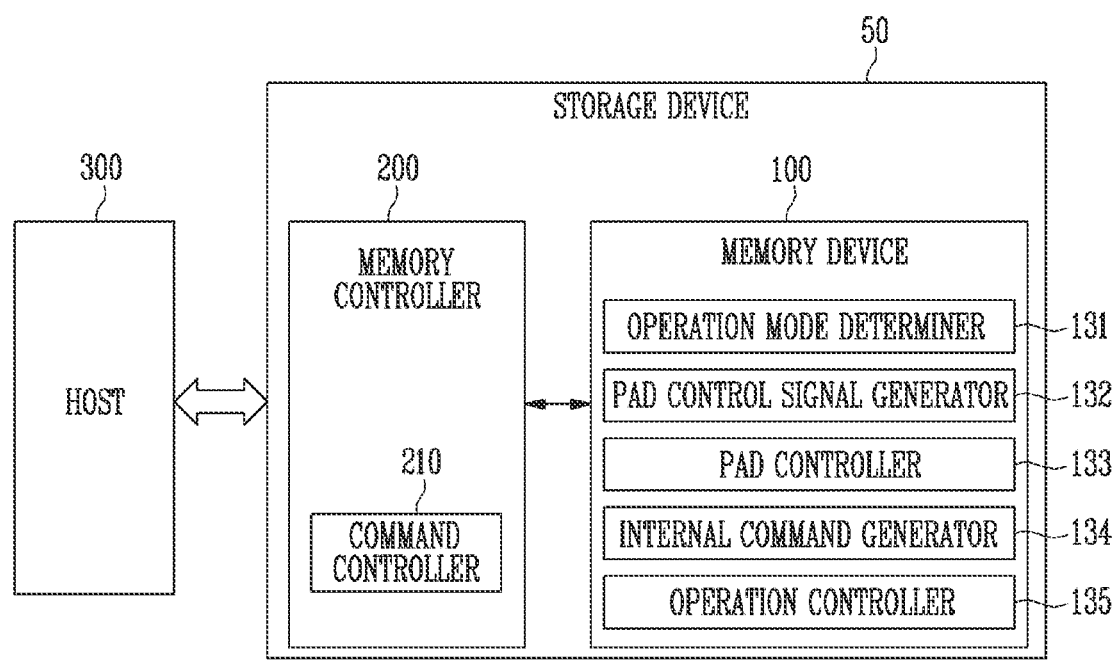
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may operate as any one of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (DDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 may receive a command CMD and an address ADDR from the memory controller 200, and access a zone selected by the address ADDR in the memory cell array. The memory device 100 may perform an operation indicated by the command CMD on the zone selected by the address ADDR. For example, the memory device 100 may perform a write operation (program operation), a read operation, and an erase operation. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

In an embodiment, the memory device 100 may include an operation mode determiner 131, a pad control signal generator 132, a pad controller 133, an internal command generator 134, and an operation controller 35.

The operation mode determiner 131 may determine an operation mode of the memory device 100 in response to an operation mode command input from the memory controller 200. The operation mode command may be a command instructing that the operation mode of the memory device 100 will be changed.

For example, the operation mode determiner 131 may determine one of a norm& operation mode and a memory communication operation mode in response to the operation mode command. The operation mode of the memory device 100 may be set as the normal operation mode or the memory communication operation mode according to the operation mode command.

The normal operation mode is a mode for performing a norm& operation, and may be a mode for performing a read operation in response to a read command input from the memory controller 200 and performing a program operation in response to a program command input from the memory controller 200.

The memory communication operation mode may be a mode for communicating data between a plurality of memory devices.

In an embodiment, the memory communication operation mode may include a first operation mode and a second operation mode.

For example, the first operation mode may be a data output mode for reading data from a plurality of memory cells and outputting the read data to another memory device. For example, the first operation mode may be a mode for performing a read operation of sensing data in response to a specific command input from the memory controller 200 and outputting the data sensed by the read operation to the another memory device.

In addition, the second operation mode may be a data input mode for receiving data output from the another memory device and storing the received data in the plurality of memory cells. For example, the second operation mode may be a mode for receiving data output from the another memory device in response to a specific command input from the memory controller 200 and performing a program operation of storing the received data.

The pad control signal generator 132 may generate a pad control signal for determining a pad to receive a signal corresponding to a data movement command of the memory controller 200 according to the operation mode of the memory device 100.

The data movement command may be a command instructing an operation of moving data between a plurality of memory devices.

The pad controller 133 may receive a signal corresponding to the data movement command through the pad determined according to the pad control signal.

The internal command generator 134 may generate an internal operation command corresponding to the data movement command according to the operation mode of the memory device 100.

The internal operation command may include one of a read operation and a program operation.

The operation controller 135 may perform a read operation of reading data to be output to the another memory device from the plurality of memory cells or a program operation of storing data input from the another memory device in the plurality of memory cells, based on the internal operation command.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host 300, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving technique to improve operational performance. The interleaving technique may be a do method for controlling operations on at least two memory devices 100 to overlap with each other.

In an embodiment, the memory controller 200 may provide a first memory device and a second memory device among a plurality of memory devices with an operation mode command for determining an operation mode of each of the first memory device and the second memory device and a data movement command.

For example, the memory controller 200 may include a command controller 210.

The command controller 210 may provide the memory device 100 with an operation mode command and a data movement command.

In an embodiment, the memory controller 200 may control the first memory device and the second memory device such that data read from the first memory device among the plurality of memory devices is moved to the second memory device according to the operation mode command and the data movement command.

The host 300 may communicate with the storage device 50 by using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
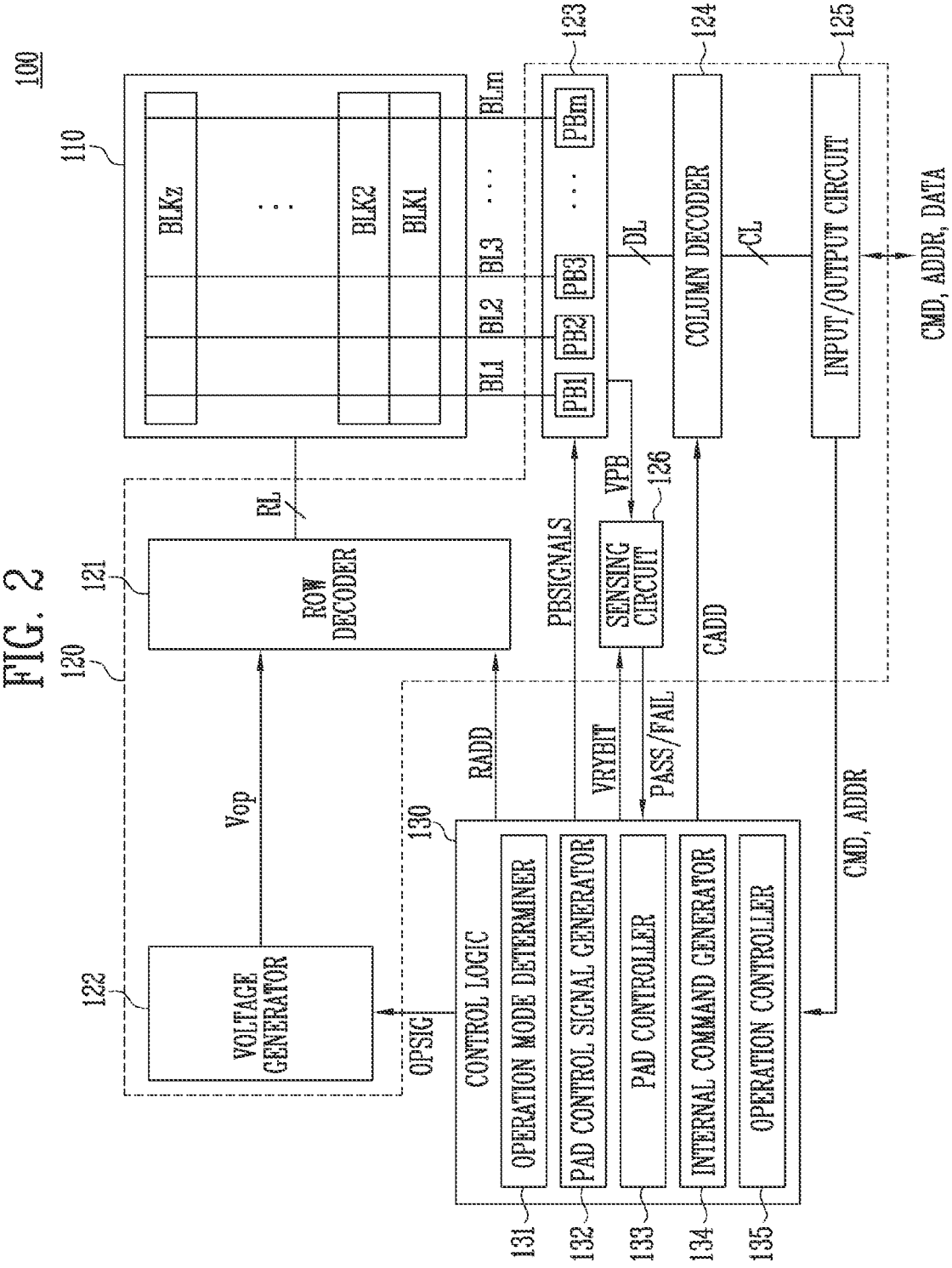
FIG. 2 is a diagram illustrating a memory device shown in FIG. 1.

FIG. 2 is a diagram illustrating the memory device 100 shown in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130.

The row decoder 121 decodes the row address RADD. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory blocks.

The voltage generator 122 operates under the control of the control logic 130. The voltage generator 122 generates a plurality of voltages by using an external power voltage supplied to the memory device 100. For example, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110 respectively through first to mth bit lines BL1 to BLm. The first to mth bit lines BL1 to BLm operate under the control of the control logic 130. For example, the first to mth bit lines BL1 to BLm may operate in response to page buffer control signals PBSIGNALS. For example, the first to mth page buffers PB1 to PBm may temporarily store data received through the first to mth bit lines BL1 to BLm, or sense a voltage or current of the bit lines BL1 to BLm in a read or verify operation.

For example, in a program operation, the first to mth page buffers PB1 to PBm may transfer data DATA received through the input/output circuit 125 to selected memory cells through the first to mth bit lines BL1 to BLm, when a program voltage is applied to a selected word line. Memory cells of a selected page are programmed according to the transferred data DATA. A memory cell connected to a bit line to which a program allow voltage (e.g., a ground voltage) is applied may have an increased threshold voltage. A threshold voltage of a memory cell connected to a bit line to which a program inhibit voltage (e.g., a power voltage) is applied may be maintained. In a program verify operation, the first to mth page buffers PB1 to PBm read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and outputs the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example the column decoder 124 may communicate data with the first to mth page buffers PB1 to PBm through data lines DL, or communicate data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or verify operation, the sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL.

In an embodiment, the control logic 130 may include an operation mode determiner 131, a pad control signal generator 132, a pad controller 133, an internal command generator 134, and an operation controller 135.

The operation mode determiner 131, the pad control signal generator 132, the pad controller 133, the internal command generator 134, and the operation controller 135 may respectively represent the operation mode determiner 131, the pad control signal generator 132, the pad controller 133, the internal command generator 134, and the operation controller 135, which are shown in FIG. 1.

The operation mode determiner 131, the pad control signal generator 132, the pad controller 133, the internal command generator 134, and the operation controller 135 will be described with reference to FIG. 7.

Figure 3:
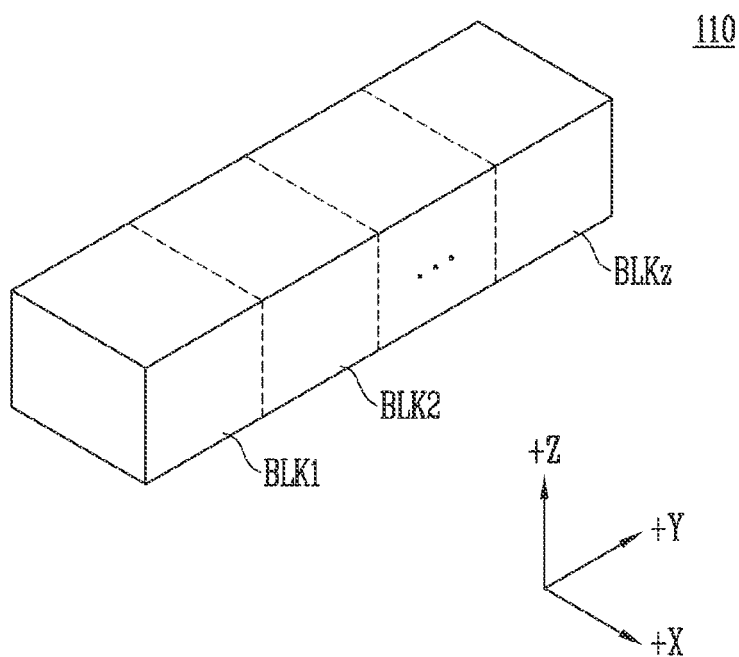
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block be described in more detail with reference to FIGS. 4 and 5.

Figure 4:
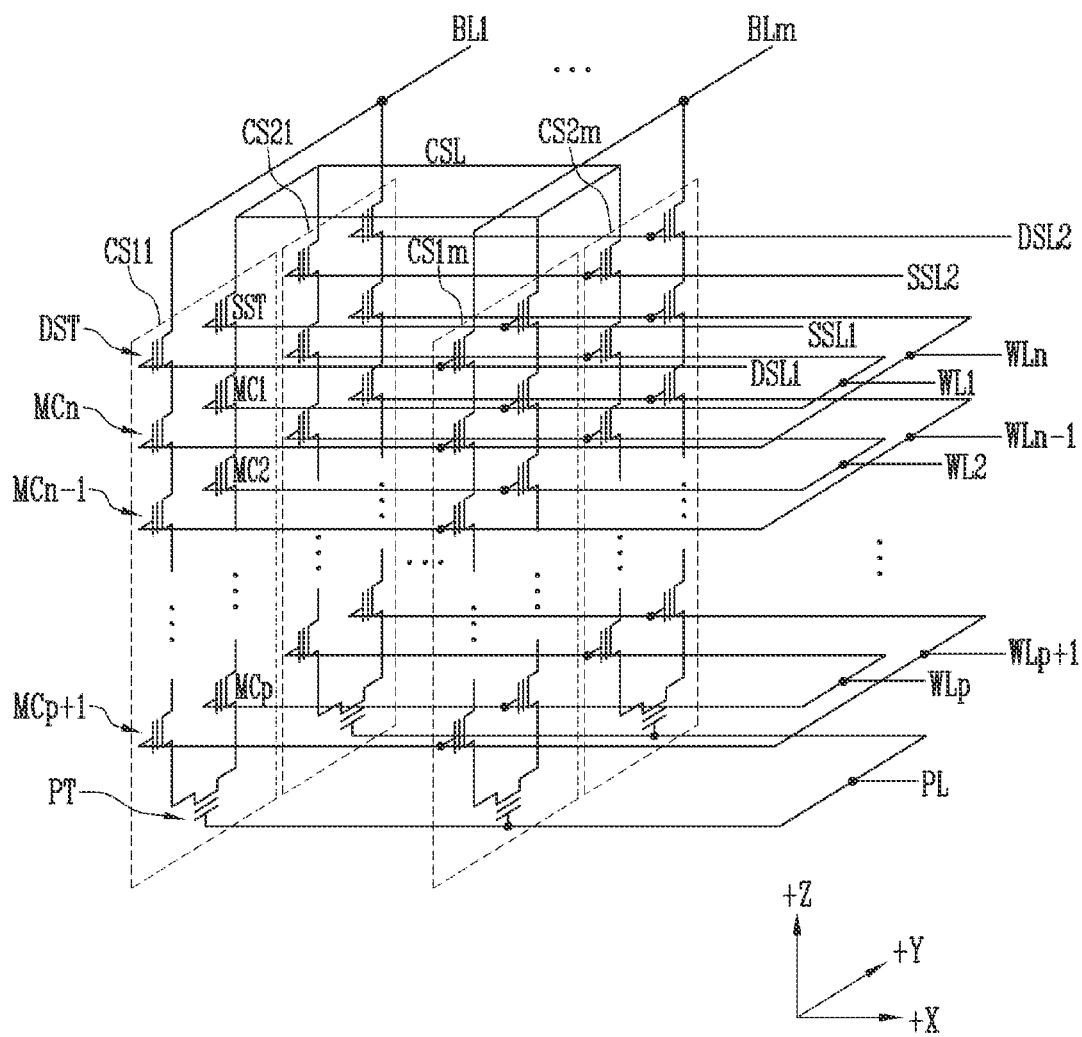
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1$m$ on a first row are connected to a first source select line SSL1. The source select transistors of the cell strings CS21 to CS2$m$ on a second row are connected to a second source select line SSL2.

In another embodiment, the source select transistors of the cell strings CS11 to CS1$m$ and CS21 to CS2$m$ may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 5:
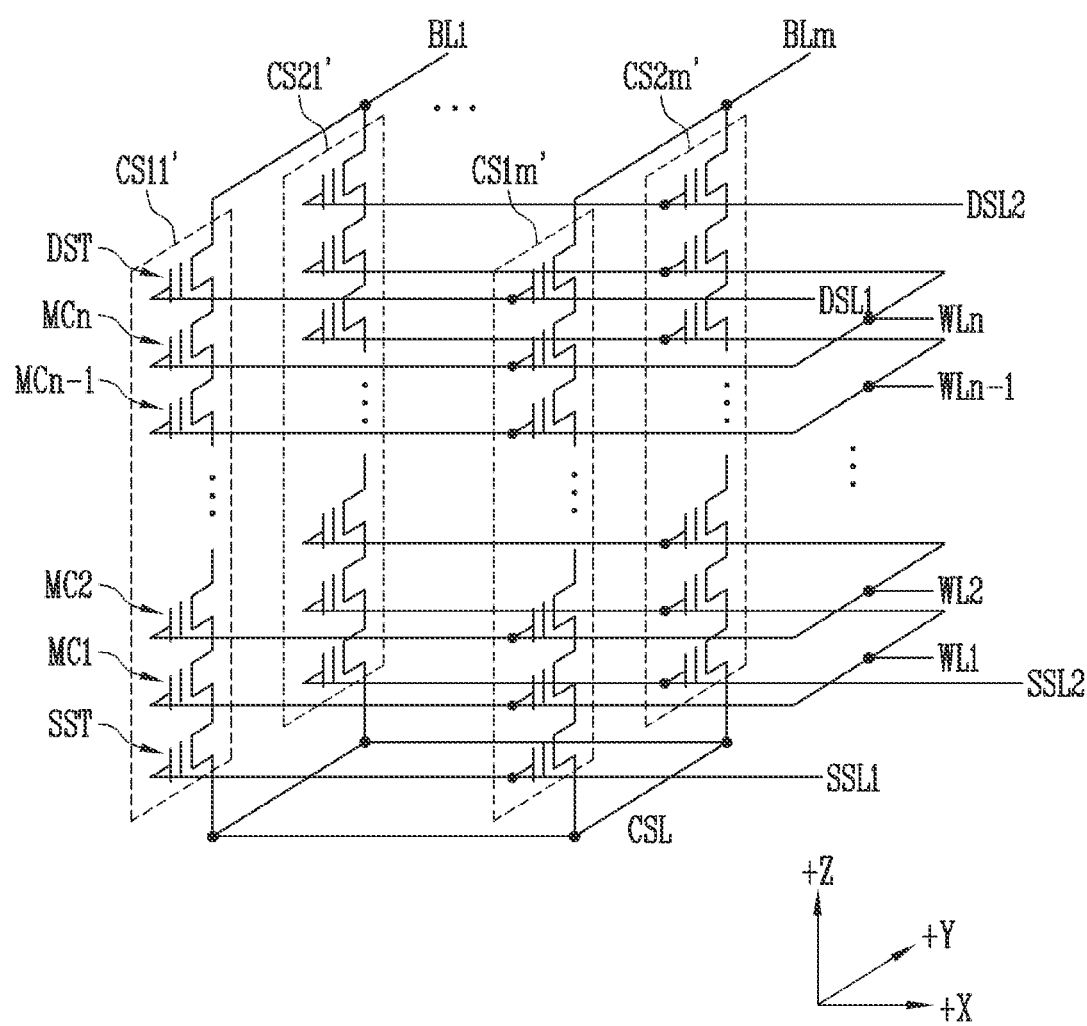
FIG. 5 is a circuit diagram illustrating another embodiment of the one memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
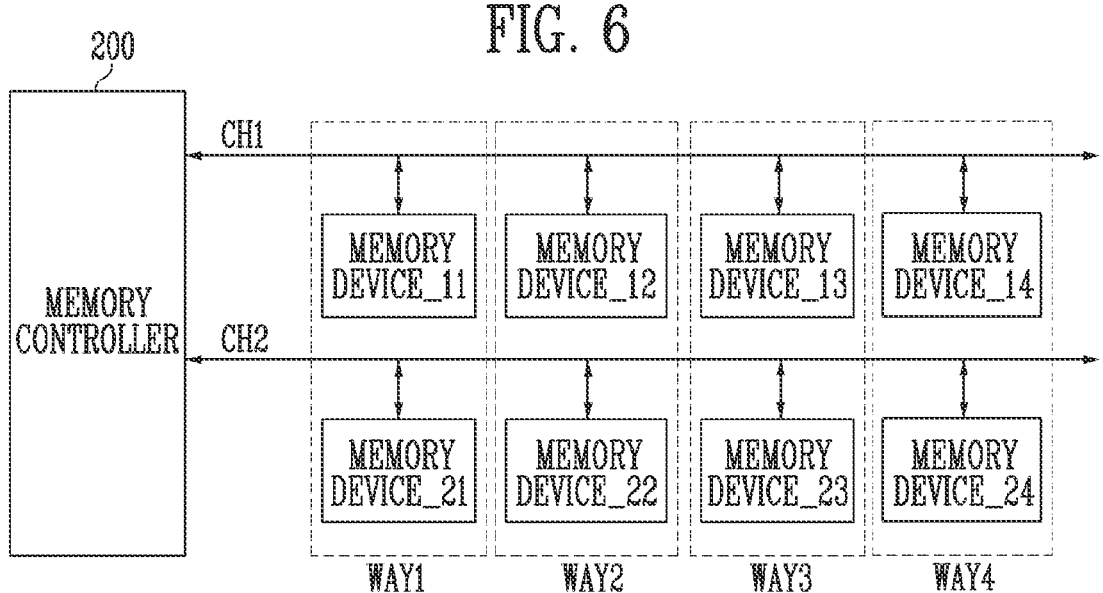
FIG. 6 is a diagram illustrating, for example, a connection relationship between a memory controller shown in FIG. 1 and a plurality of memory devices.

FIG. 6 is a diagram illustrating, for example, a connection relationship between the memory controller shown in FIG. 1 and a plurality of memory devices.

Referring to FIG. 6, the memory controller 200 may be connected to a plurality of memory devices (memory device_11 to memory device_24) through a plurality of channels CH1 and CH2. In an embodiment, it will be understood that the number of channels or the number of memory devices connected to each channel may be various modified. However, in this specification, it is assumed that the memory controller 200 is connected to memory devices through two channels, and four memory devices are connected to each channel.

For convenience of description, an operation of memory device_11, memory device_12, memory device_13, and memory device_14, which are connected to a first channel CH1, will be described. It will be understood that memory devices (memory device_21 to memory device_24) connected to the other channel CH2 are also operated like the memory device_11, the memory device_12, the memory device_13, and the memory device_14.

The memory device_11 to the memory device_14 may be commonly connected to the first channel CH1. The memory device_11 to the memory device_14 may communicate with the memory controller 200 through the first channel CH1. Since the memory device_11 to the memory device_14 are commonly connected through the first channel CH1, only one memory device may communicate with the memory controller 200 at one time. However, operations internally performed respectively by the memory device_11 to the memory device_14 may be simultaneously performed. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The storage device using a plurality of memory devices can improve performance by using the interleaving technique described with reference to FIG. 1. For the purpose of the interleaving technique, the memory devices may be managed in a channel and way unit. In order to maximize the parallelization of memory devices connected to each channel, the memory controller 200 may distribute and allocate a continuous logical memory zone in the channel and way unit.

For example, the memory controller 200 may transmit a command, a control signal including an address, and data to the memory device_11 through the first channel CH1. While the memory device_11 is programming the received data in a memory cell included therein, the memory controller may transmit a command, a control signal including an address, and data to the memory device_12.

In FIG. 6, the plurality of memory devices may constitute four ways WAY1 to WAY4. A first way WAY1 may include the memory device_11 and the memory device_21. A second way WAY2 may include the memory device_12 and the memory device 22. A third way WAY3 may include the memory device_13 and the memory device_23. A fourth way WAY4 may include the memory device_14 and the memory device_24.

Each of the channels CH1 and CH2 may be a bus of signals which share and use memory devices connected to the corresponding channel.

Although Interleaving in a 2-channel/4-way structure has been described in FIG. 6, the interleaving may become more efficiency as a number of channels becomes larger and as a number of ways becomes larger.

Meanwhile, when the storage device 50 performs operations such as garbage collection, the memory controller 200 is to repeat a process of reading data from one of the plurality of memory devices (memory device_11 to memory device_24), and transferring the read data to another memory device among the plurality of memory devices (memory device_11 to memory device_24). Therefore, the operation speed of the storage device 50 becomes slower as a number of times the memory controller 200 receives and transfers data between the memory devices increases.

Accordingly, in accordance with an embodiment of the present disclosure, one memory device among the plurality of memory devices (memory device_11 to memory device_24) directly transfers data to the another memory device without passing through the memory controller 200, so that the operation speed of the storage device 50 can be improved.

Figure 7:
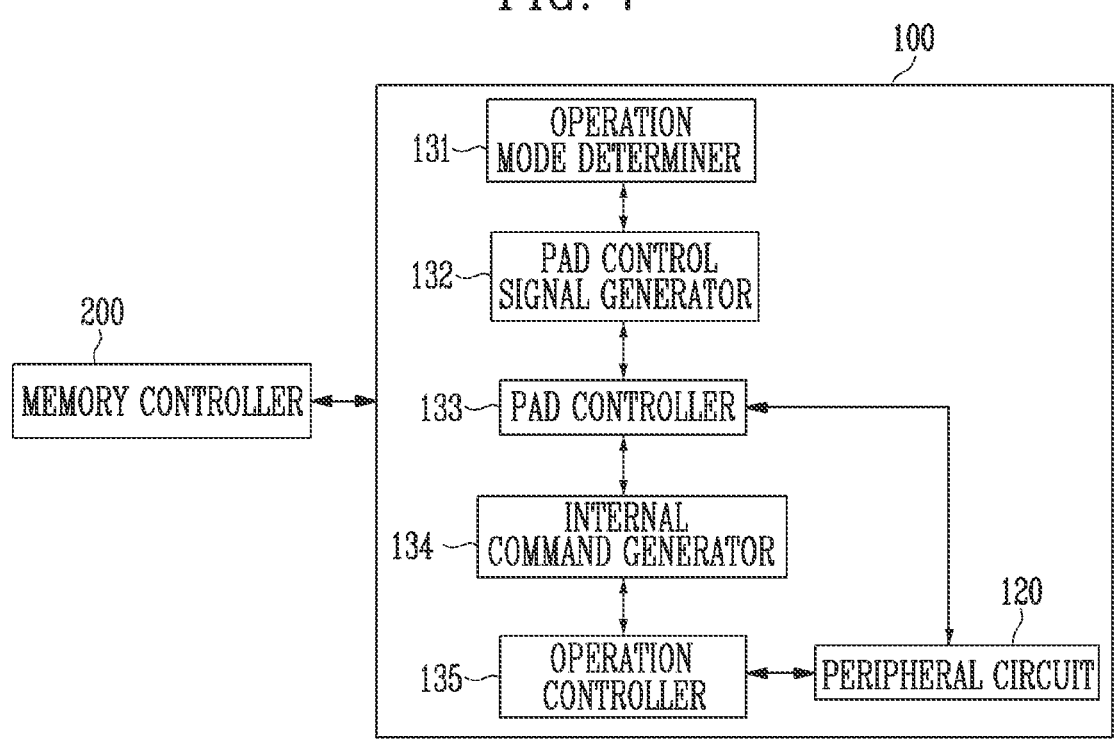
FIG. 7 is a diagram illustrating a memory device in accordance with an embodiment of the present disclosure.

FIG. 7 is a diagram illustrating a memory device in accordance with an embodiment of the present disclosure.

The memory device 100 shown in FIG. 7 may be any one of the plurality of memory devices shown in FIG. 1 or 6.

Referring to FIG. 7, the memory device 100 may include an operation mode determiner 131, a pad control signal generator 132, a pad controller 133, an internal command generator 134, and an operation controller 135. The operation mode determiner 131, the pad control signal generator 132, the pad controller 133, the internal command generator 134, and the operation controller 135 may respectively represent the operation mode determiner 131, the pad control signal generator 132, the pad controller 133, the internal command generator 134, and the operation controller 135, which are shown in FIG. 1. In an embodiment the memory device 100 may include the operation mode determiner 131, the pad control signal generator 132, the pad controller 133, the internal command generator 134, the operation controller 135, and the peripheral circuit 120.

The operation mode determiner 131 may determine any one of a normal operation mode and a memory communication operation mode according to an operation mode command input from the memory controller 200.

The operation mode command may be a command instructing that an operation mode of the memory device 100 will be changed.

In an embodiment, the memory communication operation mode may include a data output mode and a data input mode.

For example, the operation mode determiner 131 may determine one of the normal operation mode, the data output mode, and the data input mode according to the operation mode command.

The pad control signal generator 132 may generate a pad control signal for determining a pad to receive a signal corresponding to a data movement command of the memory controller 200 according to the determined operation mode.

For example, the pad control signal generator 132 may change an input signal toggled when the data movement command is input to an output signal instructing an operation corresponding to the data movement command.

In an embodiment, the pad control signal may include one of a read enable control signal for controlling a read enable (RE) pad and a data strobe control signal for controlling a data strobe (DQS) pad.

In an embodiment, the pad control signal generator 132 may generate the read enable control signal, when the operation mode of the memory device 100 is determined as the data output mode.

Also, in an embodiment, the pad control signal generator 132 may generate the data strobe control signal, when the operation mode of the memory device 100 is determined as the data input mode.

The pad controller 133 may receive a signal corresponding to the data movement command through the pad determined according to the pad control signal.

For example, the pad controller 133 may control the input/output circuit 125 to transfer the signal corresponding to the data movement command to the memory device 100 through the determined pad.

In an embodiment, the pad controller 133 may receive the signal corresponding to the data movement command through the read enable pad according to the read enable control signal. For example, the pad control signal generator 132 may change the input signal toggled when the data movement command is input to a read enable signal according to the read enable control signal.

In an embodiment, the pad controller 133 may receive an output address corresponding to the data movement command through the read enable pad according to the read enable control signal. The output address may represent an address of an area from which data is to be read in the memory cell array.

Also, in an embodiment, the pad controller 133 may receive the signal corresponding to the data movement command through the data strobe pad according to the data strobe control signal. For example, the pad control signal generator 132 may change the input signal toggled when the data movement command is input to a data strobe signal according to the data strobe control signal.

Also, in an embodiment, the pad controller 133 may receive data corresponding to the data movement command through the data strobe pad. The data corresponding to the data movement command may be data input from another memory device.

Also, in an embodiment, the pad controller 133 may receive an input address corresponding to the data movement command through the data strobe pad according to the data strobe control signal. The input address may represent an address of an area in which data is to be stored in the memory cell array.

The internal command generator 134 may generate an internal operation command corresponding to the data movement command according to the determined operation mode.

In an embodiment, the internal operation command may include one of a read command and a program command.

In an embodiment, the internal command generator 134 may generate the read command, when the operation mode of the memory device 100 is determined as the data output mode.

Also, in an embodiment, the internal command generator 134 may generate the program command, when the operation mode of the memory device 100 is determined as the data input mode.

For example, the internal command generator 134 may generate a read enable value or a program enable value in response to the data movement command, based on the operation mode of the memory device 100. For example, when the data movement command is the read command, the internal command generator 134 may generate the read enable value. Also, when the data movement command is the program command, the internal command generator 134 may generate the program enable value.

The operation controller 135 may perform one of a read operation of reading first target data to be output to another memory device from a plurality of memory cells and a program operation of storing second target data input from the another memory device in the plurality of memory cells, based on the internal operation command.

The first target data may represent data read from the plurality of memory cells to be output to the another memory device. The second target data may represent data input from the another memory device.

For example, the operation controller 135 may control the peripheral circuit 120 to perform the read operation or the program operation, based on the internal operation command.

In an embodiment, the operation controller 135 may read first target data from the plurality of memory cells and output the first target data to the another memory device, in response to the read command. For example, the operation controller 135 may control the peripheral circuit 120 to read the first target data in response to the read enable value. The operation controller 135 may control the peripheral circuit 120 to read the first target data corresponding to an output address input through the read enable pad.

In an embodiment, the operation controller 135 may store second target data input through the data strobe pad in a plurality of memory cells in response to the program command. For example, the operation controller 135 may control the peripheral circuit 120 to program the second target data in response to the program enable value. The operation controller 135 may control the peripheral circuit 120 to program the second target data in an area corresponding to an input address input through the data strobe pad.

Figure 8:
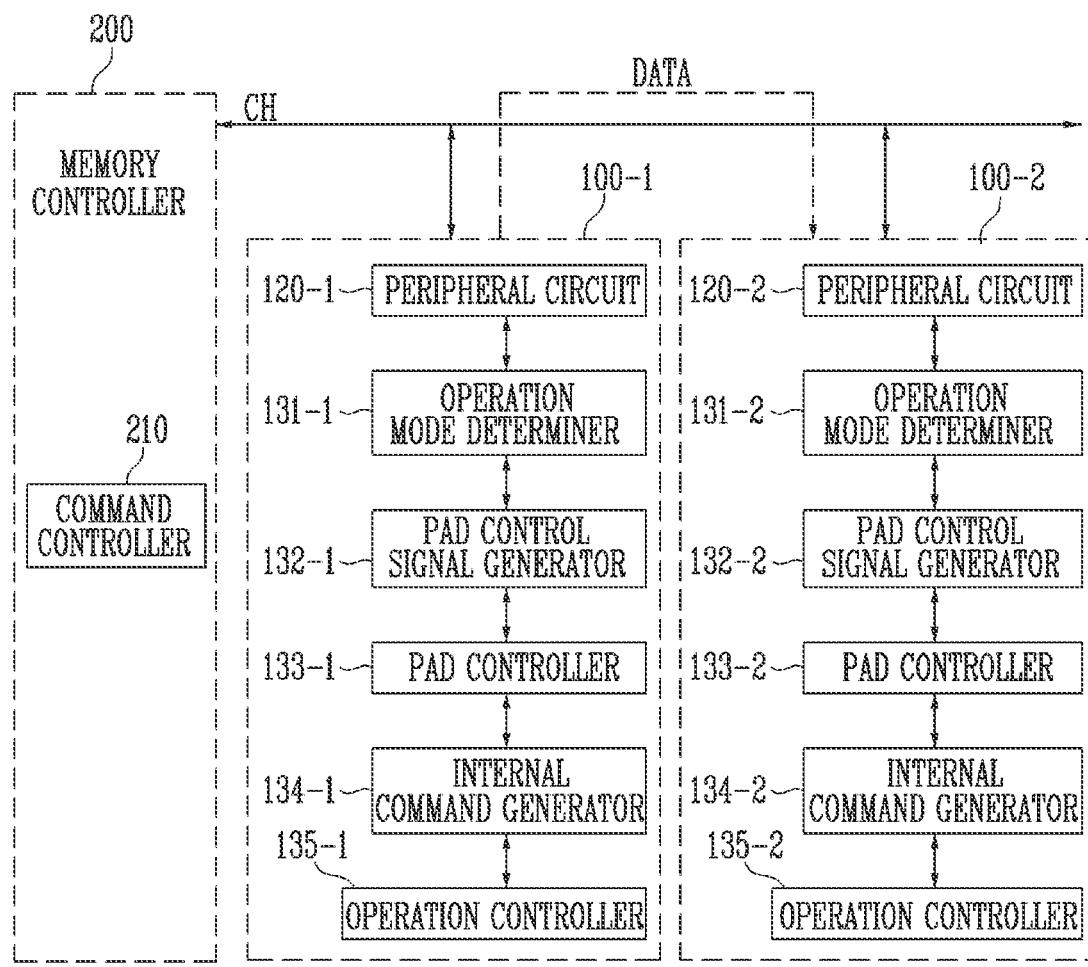
FIG. 8 is a diagram illustrating a storage device in accordance with an embodiment of the present disclosure.

FIG. 8 is a diagram illustrating a storage device in accordance with an embodiment of the present disclosure.

In FIG. 8, a first memory device 100-1 and a second memory device 100-2 may be some of the plurality of memory devices shown in FIG. 1 or 6. In addition, the memory controller 200 may be connected to the first memory device 100-1 and the second memory device 100-2 through one channel CH. In an embodiment, it will be understood that the number of channels and the number of memory devices connected to each channel may be variously changed. However, for convenience of description, in FIG. 8, it is assumed that the memory controller 200 is connected to memory devices through one channel CH, and two memory devices are connected to the corresponding channel CH.

For convenience of description, it is described that, in a process in which data is transferred between the first memory device 100-1 and the second memory device 100-2, the first memory device 100-1 is an output memory device to output data and the second memory device 100-2 is an input memory device to receive data. Therefore, in some embodiments, it will be understood that the second memory device 100-2 operates as an input memory device and the first memory device 100-1 operates as an output memory device.

Referring to FIG. 8, the memory controller 200 may include a command controller 210. The command controller 210 may represent the command controller 210 shown in FIG. 1.

In addition, the first memory device 100-1 and the second memory device 100-2 may include peripheral circuits 120-1 and 120-2, operation mode determiners 131-1 and 131-2, pad control signal generators 132-1 and 132-2, pad controllers 133-1 and 133-2, internal command generators 134-1 and 134-2, and operation controllers 135-1 and 135-2, respectively. The peripheral circuits 120-1 and 120-2, the operation mode determiners 131-1 and 131-2, the pad control signal generators 132-1 and 132-2, the pad controllers 133-1 and 133-2, the internal command generators 134-1 and 134-2, and the operation controllers 135-1 and 135-2 may respectively represent the peripheral circuit 120, an operation mode determiner 131, the pad control signal generator 132, the pad controller 133, the internal command generator 134, and the operation controller 135, which are shown in FIG. 7.

The command controller 210 may be included in the memory controller 200. The command controller 210 may provide an operation mode command and a data movement command to each of the first memory device 100-1 and the second memory device 100-2.

For example, when it is determined that data movement between the first memory device 100-1 and the second memory device 100-2 is necessary such as garbage collection, the command controller 210 may generate the operation mode command and the data movement command.

In an embodiment, the command controller 210 may provide the operation mode command to the first memory device 100-1 and the second memory device 100-2 and then provide the data movement command to the first memory device 100-1 and the second memory device 100-2.

In an embodiment, the command controller 210 may provide an output address to the first memory device 100-1, and provide an input address to the second memory device 100-2.

The output address may be information representing an area in which data DATA is to be sensed in a memory cell array included in the first memory device 100-1 in a read operation corresponding to the data movement command in the first memory device 100-1.

The input address may be information representing an area in which data DATA is to be programmed in a memory cell array included in the second memory device 100-2 in a program operation corresponding to the data movement command in the second memory device 100-2.

In an embodiment, the first memory device 100-1 may perform a read operation in response to the data movement command according to a first operation mode, and output data DATA read by the read operation. The first operation mode may be a data output mode for outputting data sensed from a plurality of memory cells to another memory device.

In an embodiment, the first memory device 100-1 may determine an operation mode of the memory device 100-1 as the first operation mode in response to the operation mode command.

In an embodiment, the first memory device 100-1 may generate a read enable control signal for controlling a read enable pad according to the first operation mode. Also, the first memory device 100-1 may receive a signal corresponding to the data movement command and the output address through the read enable pad according to the read enable control signal.

Also, in an embodiment, the first memory device 100-1 may sense data DATA from the output address among memory cells included in the first memory device 100-1 in response the data movement command, and output the sensed data DATA to the second memory device 100-2.

In an embodiment, the second memory device 100-2 may receive the data DATA output from the first memory device 100-1. Also, the second memory device 100-2 may perform a program operation of storing the data DATA in response to the data movement command according to a second operation mode. The second operation mode may be a data input mode for receiving data output from another memory device and storing the received data.

In an embodiment, the second memory device 100-2 may determine an operation mode of the second memory device 100-2 as the second operation mode in response to the operation mode command.

In an embodiment, the second memory device 100-2 may generate a data strobe control signal for controlling a data strobe pad according to the second operation mode. Also, the second memory device 100-2 may receive a signal corresponding to the data movement command, the input address, and data DATA through the data strobe pad according to the data strobe control signal.

Also, in an embodiment, the second memory device 100-2 may program the data DATA in an area selected by the input address among memory cells included in the second memory device 100-2 in response to the data movement command.

Meanwhile, although an operation of transmitting data output from one memory device to another memory device has been described above, the present disclosure is not necessarily limited thereto. In some embodiments, data output from one or more memory devices may be transferred to the another memory device.

In an embodiment, the memory controller 200 may provide an operation mode command to each of one or more output memory devices to output data and an input memory device to receive data among a plurality of memory devices. Also, the memory controller 200 may control the plurality of memory devices such that data respectively read from the one or more output memory devices are moved to the input memory device, based on the operation mode of each of the one or more output memory devices and the input memory device, which is determined according to the operation mode command.

Each of the one or more output memory devices may be implemented identically to the first memory device 100-1. Therefore, operations implemented in the first memory device 100-1 and components included in the first memory device 100-1 may be implemented identically in the one or more output memory devices.

In addition, the input memory device may be implemented identically to the second memory device 100-2. Therefore, operations Implemented in the second memory devices and components included in the second memory device 100-2 may be implemented identically in the input memory device.

In an embodiment an operation mode of each of the one or more output memory devices may be determined as a first operation mode for performing a read operation in response to the data movement command input from the memory controller 200 according to the operation mode command.

In an embodiment, an operation mode of the input memory device may be determined as a second operation mode for performing a program operation in response to the data movement command input from the memory controller 200 according to the operation mode command.

In accordance with the embodiment of the present disclosure, a command instructing a data movement operation is provided after an operation mode of each of the first memory device 100-1 and the second memory device 100-2 is set, so that data of the first memory device 100-1 can be immediately transferred to the second memory device 100-2 without passing through the memory controller 200. Accordingly, the operation speed of the storage device can be improved.

Figure 9:
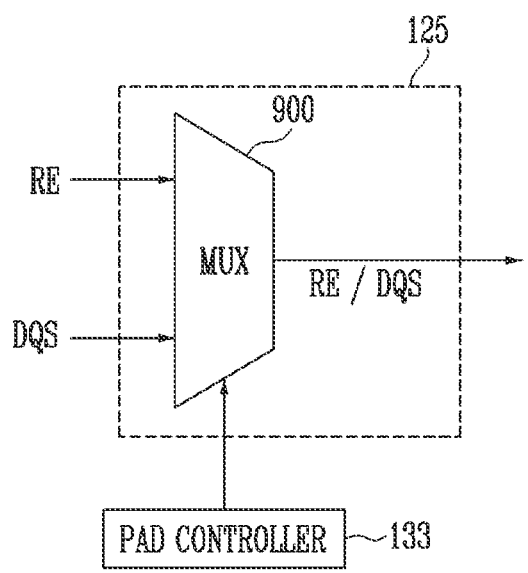
FIG. 9 is a diagram illustrating a pad controller shown in FIG. 7.

FIG. 9 is a diagram illustrating the pad controller shown in FIG. 7.

Referring to FIG. 9, the input/output circuit 125 may include a multiplexer (MUX) 900.

Although a case where the input/output circuit 125 receives a read enable (RE) signal and a data strobe (DQS) signal is illustrated in FIG. 9, the present disclosure is not necessarily limited thereto, and the input/output circuit 125 may receive various signals.

In an embodiment, the pad controller 133 may control the MUX 900.

For example, the pad controller 133 pad control the MUX 900 to output one of the read enable (RE) signal and the data strobe (DQS) signal, based on an operation mode determined according to the operation mode command. The MUX 900 may receive an input signal corresponding to a pad (or pin) to which the data movement command is input, and output an output signal instructing one of a read operation and a program operation, which is performed according to the operation mode.

In an embodiment, when the operation mode of the memory device 100 is the data output mode, the pad controller 133 may control the MUX 900 to output, as the read enable (RE) signal, a signal corresponding to the data movement command input to the read enable (RE) pad or the data strobe (DQS) pad.

In an embodiment, when the operation mode of the memory device 100 is the data input mode, the pad controller 133 may control the MUX 900 to output, the data strobe (DQS) signal, a signal corresponding to the data movement command input to the read enable (RE) pad or the data strobe (DQS) pad.

Accordingly, although the data movement command is input to the read enable (RE) pad or the data strobe (DQS) pad, the memory device 100 can output a signal corresponding to the operation mode.

Figure 10:
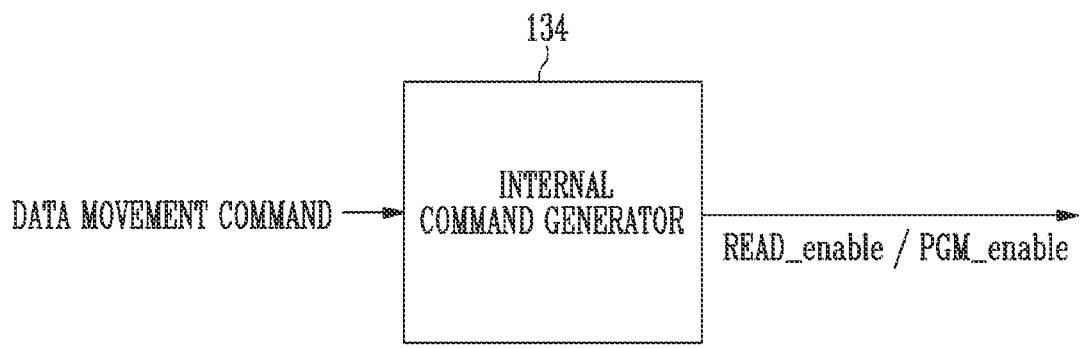
FIG. 10 is a diagram illustrating an operation of an internal command generator shown in FIG. 7.

FIG. 10 is a diagram illustrating an operation of the internal command generator shown in FIG. 7.

Referring to FIG. 10, the internal command generator 134 may generate a read enable value READ_enable corresponding to a read operation or generate a program enable value PGM_enable corresponding to a program operation, in response to the data movement command.

In an embodiment, when the data movement command is input to the memory device 100 of which the operation mode is determined as a first operation mode, the internal command generator 134 may generate the read enable value READ_enable which allows the read operation to be performed.

In an embodiment, when the data movement command is input to the memory device 100 of which the operation mode is determined as a second operation mode, the internal command generator 134 may generate the program enable value PGM_enable which allow the program operation to be performed.

Accordingly, when the data movement command is input to the memory device 100 of which the operation mode is determined, the memory device 100 can generate an enable value to operate according to the determined operation mode.

Figure 11:
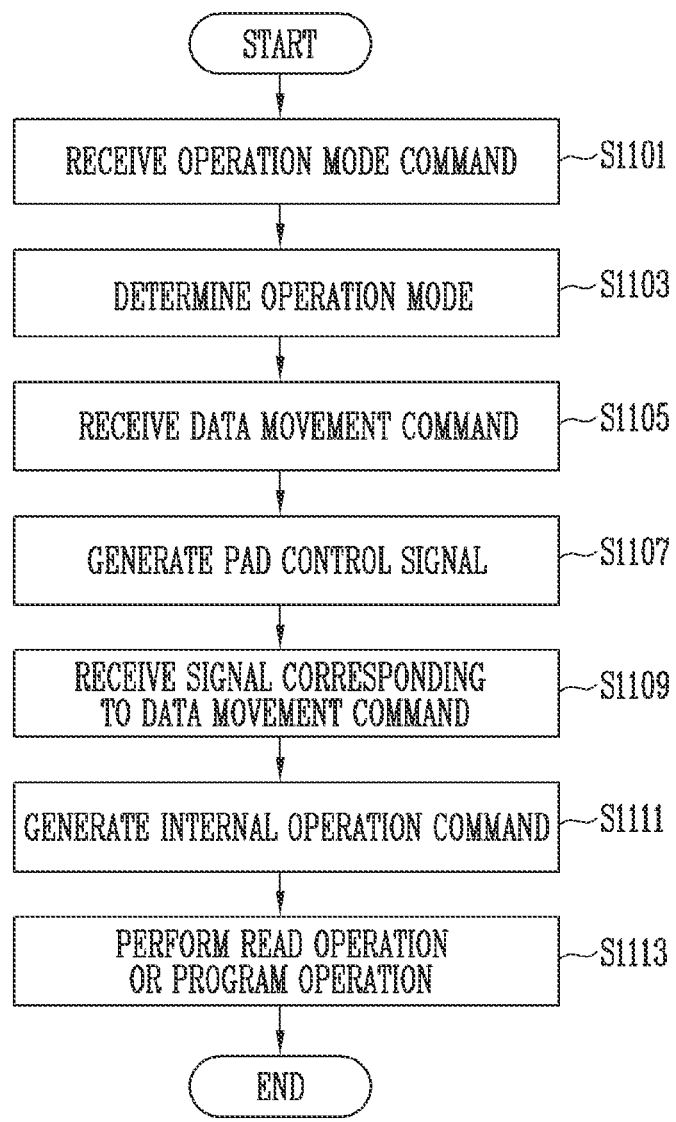
FIG. 11 is a flowchart illustrating an operating method of a memory device in accordance with an embodiment of the present disclosure.

FIG. 11 is a flowchart illustrating an operating method of the memory device in accordance with an embodiment of the present disclosure.

The operating method shown in FIG. 11 may be performed by, for example, the memory device 100 shown in FIG. 7.

Referring to FIG. 11, in step S1101 the memory device 100 may receive an operation mode command input from the memory controller 200.

In step S1103, the memory device 100 may determine any one of a normal operation mode and a memory communication operation mode according to the operation mode command.

The memory device 100 may determine one of the normal operation mode, a data output mode, and a data input mode.

In step S1105, the memory device 100 may receive a data movement command input from the memory controller 200.

In step S1107, the memory device 100 may generate a pad control signal for determining a pad to receive a signal corresponding to the data movement command according to the determined operation mode.

The memory device 100 may generate a read enable control signal for controlling a read enable pad in response to the data output mode.

Also, the memory device 100 may generate a data strobe control signal for controlling a data strobe pad in response to the data input mode.

In step S1109, the memory device 100 may receive a signal corresponding to the data movement command through the pad determined according to the pad control signal.

The memory device 100 may receive a signal corresponding to the data movement command through the read enable pad according to the read enable control signal.

Also, the memory device 100 may receive a signal corresponding to the data movement command and second target data through the data strobe pad according to the data strobe control signal.

In step S1111, the memory device 100 may generate an internal operation command corresponding to the data movement command according to the determined operation mode.

The memory device 100 may generate a read command in response to the data output mode.

Also, the memory device 100 may generate a program command in response to the data input mode.

In step S1113, the memory device 100 may perform one of a read operation of reading first target data to be output to another memory device from a plurality of memory cells and a program operation of storing the second target data input from the another memory device in the plurality of memory cells, based on the internal operation command.

The memory device 100 may read the first target data from the plurality of memory cells in response to the read command.

Subsequently, the memory device 100 may output the first target data to the another memory device.

Also, the memory device 100 may store the second target data input through the determined pad to the plurality of memory cells in response to the program command.

Figure 12:
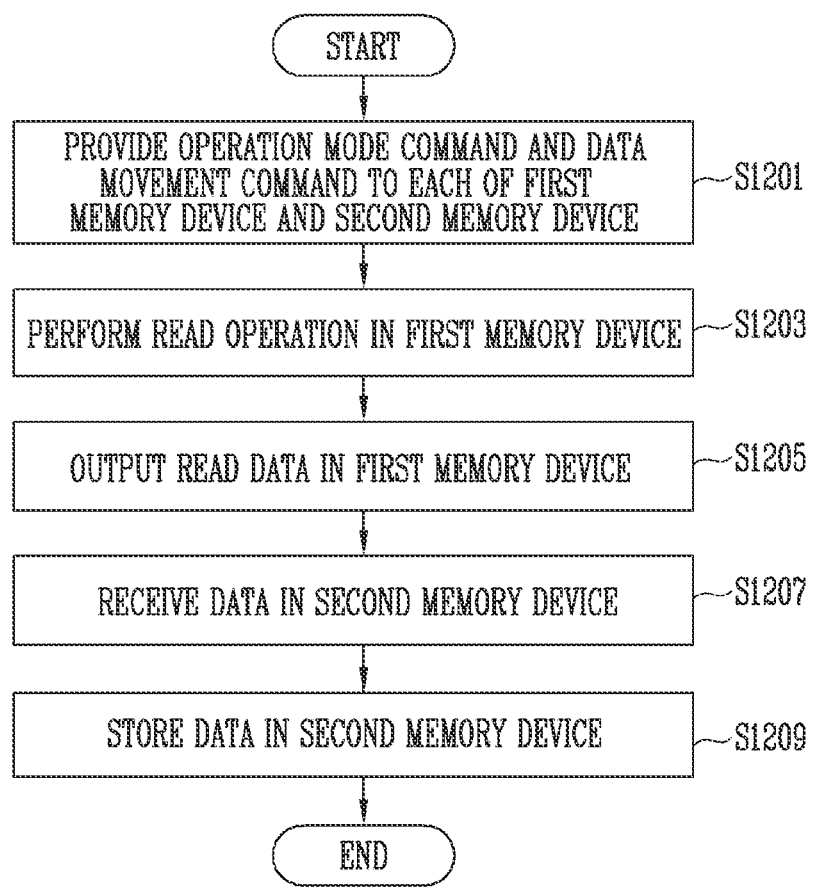
FIG. 12 is a flowchart illustrating an operating method of a storage device in accordance with an embodiment of the present disclosure.

FIG. 12 is a flowchart illustrating an operating method of a storage device in accordance with an embodiment of the present disclosure.

The operating method shown in FIG. 12 may be performed by, for example, the storage device 50. It is assumed that an operation mode of a first memory device is set as a first operation mode according to an operation mode command, and an operation mode of a second memory device is set as a second operation mode according to the operation mode command.

Referring to FIG. 12, in step S1201, the storage device 50 may provide an operation mode command and a data movement command to each of the first memory device and the second memory device.

In step S1203, the storage device 50 may perform a read operation in response to the data movement command according to the first operation mode in the first memory device.

In step S1205, the storage device 50 may output data read by the read operation performed according to the first operation mode to the second memory device.

In step S1207, the second memory device included in the storage device 50 may receive the data output from the first memory device included in the storage device 50.

In step S1209, the storage device 50 may perform a program operation of storing data in response to the data movement command according to the second operation mode in the second memory device.

Figure 13:
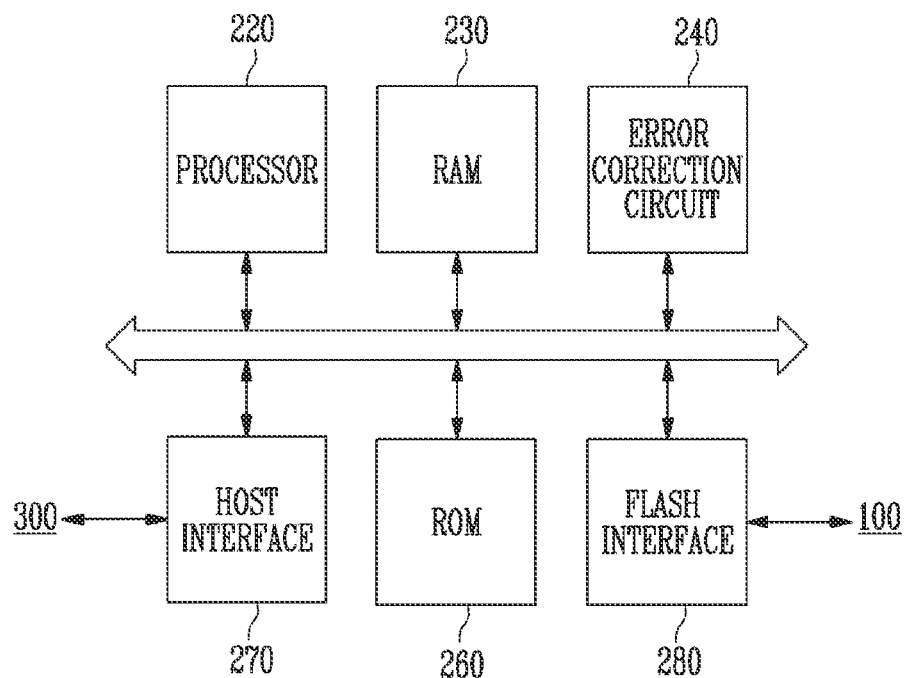
FIG. 13 is a diagram illustrating the memory controller shown in FIG. 1.

FIG. 13 is a diagram illustrating the memory controller shown in FIG. 1.

Referring to FIGS. 1 and 13, the memory controller 200 may include a processor 220, a RAM 230, an error correction circuit 240, ROM 260, a host interface 270, and a flash interface 280.

The processor 220 may control overall operations of the memory controller 200. The RAM 230 may be used as a buffer memory, a cache memory, a working memory, etc. of the memory controller 200.

The error correction circuit 240 may perform error correction. The error correction circuit 240 may perform error correction code (ECC) encoding on data to be written to the memory device through the flash interface 280. The ECC-encoded data may be transferred to the memory device through the flash interface 280. The error correction circuit 240 may perform ECC decoding on data received from the memory device through the flash interface 280. For example, the error correction circuit 240 may be included as a component of the flash interface 280 in the flash interface 280.

The ROM 260 may store, in the form of firmware, various information required in an operation of the memory controller 200. In an embodiment, the command controller 210 shown in FIG. 1 may be firmware stored in the ROM 260.

The memory controller 200 may communicate with an external device (e.g., the host 300, an application processor, or the like) through the host interface 270.

The memory controller 200 may communicate with the memory device 100 through the flash interface 280. The memory controller 200 may transmit a command CMD, an address ADDR, a control signal CTRL, and the like to the memory device 100 through the flash interface 280, and receive data DATA. For example, the flash interface 280 may include a NAND interface.

Figure 14:
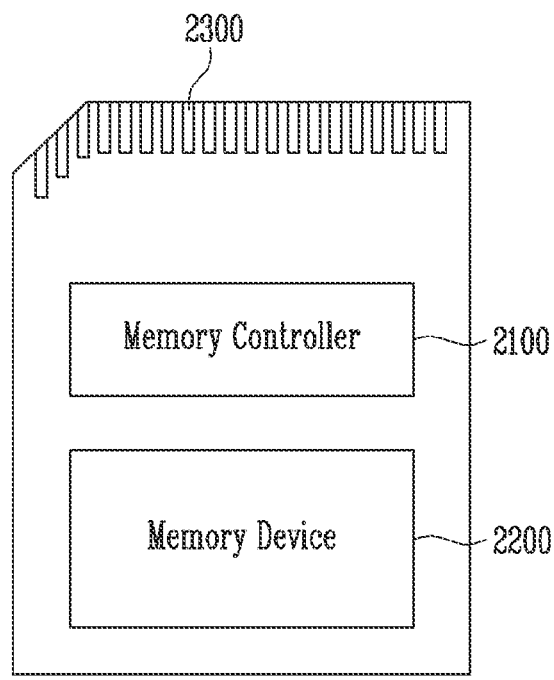
FIG. 14 is a block diagram illustrating a memory card system to which the storage device is applied in accordance with an embodiment of the present disclosure.

FIG. 14 is a block diagram illustrating a memory card system to which the storage device is applied in accordance with an embodiment of the present disclosure.

Referring to FIG. 14, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 2.

For example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. For example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), fire e, a Universal Flash Storage (UFS), Wi-Fi, Bluetooth, and NVMe.

For example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-M RAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC an SD card (SD, miniSD, microSD and SDHC), and a Universal Hash Storage (UFS).

Figure 15:
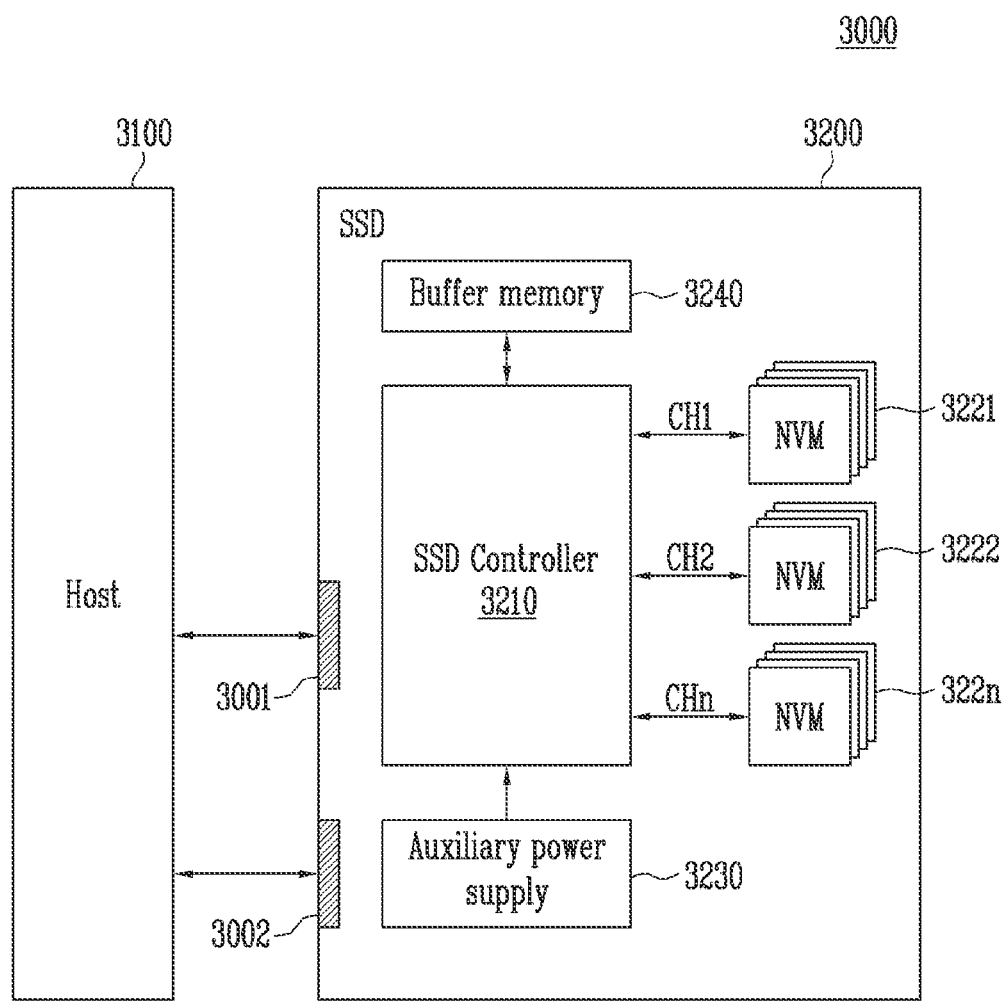
FIG. 15 is a block diagram, for example, illustrating a Solid State Drive (SSD) system to which the storage device is applied in accordance with an embodiment of the present disclosure.

FIG. 15 is a block diagram, for example, illustrating a Solid State Drive (SSD) system to which the storage device is applied in accordance with an embodiment of the present disclosure.

Referring to FIG. 15, the SSD system 3000 includes a host 3100 and an SSD 3200. The SSD 3200 exchanges a signal SIG with the host 3100 through a signal connector 3001, and receives power PVR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG.

1. In an embodiment, each flash memory from the plurality of flash memories 3221 to 322n may serve as the memory device 100 described with reference to FIG. 1.

The SSD controller 3210 may control the plurality of flash memories 3221 to 322n in response to a signal SIG received from the host 3100. For example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATH), a Small Computer System Interface (SCSI), an Enhanced Small Disk Interface (ESDI), an Integrated Drive Electronics (IDE), a firewire, a Universal Hash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. For example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 16:
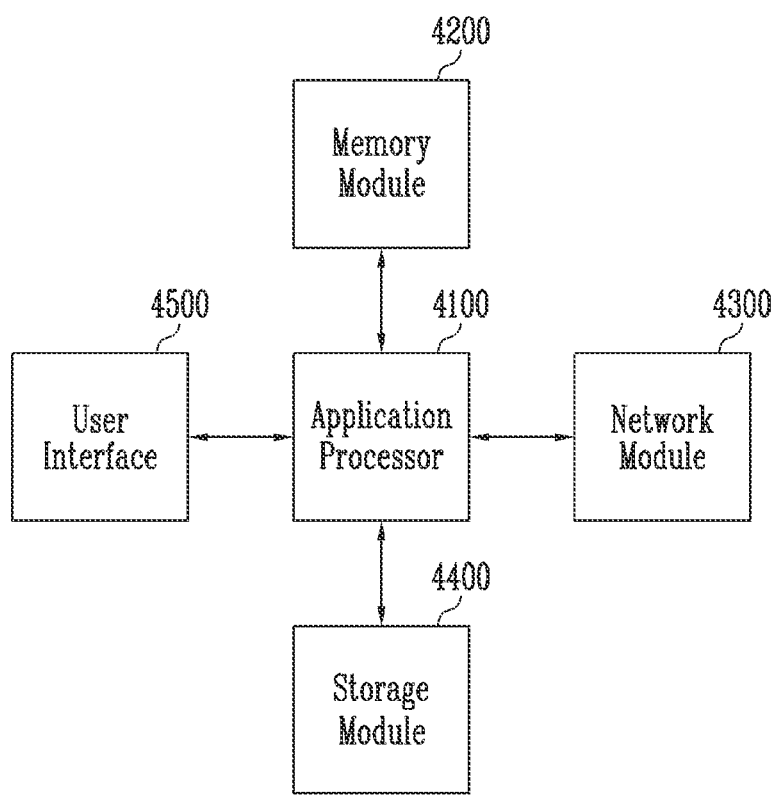
FIG. 16 is a block diagram illustrating a user system to which the storage device is applied in accordance with an embodiment of the present disclosure.

FIG. 16 is a block diagram illustrating a user system to which the storage device is applied in accordance with an embodiment of the present disclosure.

Referring to FIG. 16, the user system 4000 includes an application processor 4100, a memory module 4200, a network module 4300, a storage module 4400, and a user interface 4500.

The application processor 4100 may drive components included in the user system 4000, an operating system (OS), a user program, or the like. For example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. For example, the application processor 4100 and the memory module 4200 may be provided as one semiconductor package by being packaged based on a Package on Package (PoP).

The network module 4300 may communicate with external devices. For example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. For example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. For example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a storage device having an improved operation speed and an operating method thereof.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a plurality of memory cells;
   an operation mode determiner configured to determine any one of a normal operation mode and a memory communication operation mode of communicating data with another memory device according to an operation mode command input from a memory controller;
   a pad control signal generator configured to generate a pad control signal for determining a pad to receive a signal corresponding to a data movement command of the memory controller according to the determined operation mode;
   a pad controller configured to receive the signal corresponding to the data movement command through the determined pad according to the pad control signal;
   an internal command generator configured to generate an internal operation command corresponding to the data movement command according to the determined operation mode; and
   an operation controller configured to perform one of a read operation of reading first target data to be output to the another memory device from the plurality of memory cells and a program operation of storing second target data input from the another memory device in the plurality of memory cells, based on the internal operation command.

2. The memory device of claim 1, wherein the memory communication operation mode includes a data output mode for reading the first target data and outputting to the another memory device and a data input mode for receiving the second target data input from the another memory device and storing the second target data in the plurality of memory cells.

3. The memory device of claim 2, wherein the pad control signal includes one of a read enable control signal for controlling a read enable (RE) pad and a data strobe control signal for controlling a data strobe (DQS) pad.

4. The memory device of claim 3, wherein the pad control signal generator generates the read enable control signal, when an operation mode of the memory device is determined as the data output mode, and
   wherein the pad controller receives the signal corresponding to the data movement command through the read enable pad according to the read enable control signal.

5. The memory device of claim 3, wherein the pad control signal generator generates the data strobe control signal, when an operation mode of the memory device is determined as the data input mode, and
   wherein the pad controller receives the signal corresponding to the data movement command and the second target data through the data strobe pad according to the data strobe control signal.

6. The memory device of claim 2, wherein the internal operation command includes one of a read command and a program command.

7. The memory device of claim 6, wherein the internal command generator generates the read command, when the operation mode of the memory device is determined as the data output mode.

8. The memory device of claim 7, wherein the operation controller reads the first target data from the plurality of memory cells and outputs the first target data to the another memory device, in response to the read command.

9. The memory device of claim 6, wherein the internal command generator generates the program command, when the operation mode of the memory device is determined as the data input mode.

10. The memory device of claim 9, wherein the operation controller stores the second target data input through the determined pad in the plurality of memory cells in response to the program command.

11. A method for operating a memory device which includes a plurality of memory cells and transmits and receives data with another memory device, the method comprising:
    receiving an operation mode command input from a memory controller;
    determining any one of a normal operation mode and a memory communication operation mode according to the operation mode command;
    receiving a data movement command input from the memory controller;
    generating a pad control signal for determining a pad to receive a signal corresponding to the data movement command according to the determined operation mode;
    receiving the signal corresponding to the data movement command through the determined pad according to the pad control signal;
    generating an internal operation command corresponding to the data movement command according to the determined operation mode; and
    performing one of a read operation of reading first target data to be output to the another memory device from the plurality of memory cells and a program operation of storing second target data input from the another memory device in the plurality of memory cells, based on the internal operation command.

12. The method of claim 11, wherein, in the determining of the operation mode, one of the normal operation mode, a data output mode for reading the first target data and outputting the first target data to the another memory device, and a data input mode for receiving the second target data input from the another memory device and storing the second target data in the plurality of memory cells is determined.

13. The method of claim 12, wherein, in the generating of the pad control signal, a read enable control signal for controlling a read enable (RE) pad is generated in response to the data output mode, and
    wherein, the receiving of the signal, the signal corresponding to the data movement command is received through the read enable pad according to the read enable control signal.

14. The method of claim 12, wherein, in the generating of the pad control signal, a data strobe control signal for controlling a data strobe (DQS) pad is generated in response to the data input mode, and
    wherein, in the receiving of the signal, the signal corresponding to the data movement command and the second target data are received through the data strobe pad according to the data strobe control signal.

15. The method of claim 12, wherein, in the generating of the internal operation command, a read command is generated in response to the data output mode.

16. The method of claim 15, wherein, in the performing, the first target data is read from the plurality of memory cells in response to the read command.

17. The method of claim 16, further comprising outputting the first target data to the another memory device.

18. The method of claim 12, wherein, in the generating of the internal operation command, a program command is generated in response to the data input mode.

19. The method of claim 18, wherein, in the performing, the second target data input through the determined pad is stored in the plurality of memory cells in response to the program command.

20. A storage device comprising:
- a first memory device configured to perform a read operation in response to a data movement command according to a first operation mode, and output data read by the read operation;
- a second memory device configured to receive the data from the first memory device, and perform a program operation of storing data in response to the data movement command according to a second operation mode; and
- a memory controller configured to control the first memory device and the second memory device such that data read from the first memory device is moved to the second memory device by providing an operation mode command and the data movement command to each of the first memory device and the second memory device.

* * * * *